United States Patent
Koh

(10) Patent No.: US 7,338,858 B2
(45) Date of Patent: Mar. 4, 2008

(54) METHODS OF FABRICATING NONVOLATILE MEMORY USING A QUANTUM DOT

(75) Inventor: Kwan Joo Koh, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 282 days.

(21) Appl. No.: 11/026,715

(22) Filed: Dec. 30, 2004

(65) Prior Publication Data

US 2005/0142721 A1    Jun. 30, 2005

(30) Foreign Application Priority Data

Dec. 31, 2003    (KR)    .................. 10-2003-0101443

(51) Int. Cl.
*H01L 21/336*    (2006.01)
*H01L 29/788*    (2006.01)
(52) U.S. Cl. ................. 438/257; 438/962; 257/316
(58) Field of Classification Search ............... 438/263, 438/267, 266, 264, 22; 257/316
See application file for complete search history.

(56) References Cited

U.S. PATENT DOCUMENTS

| 4,581,621 | A |  | 4/1986 | Reed | .................. 257/20 |
|---|---|---|---|---|---|
| 5,291,034 | A |  | 3/1994 | Allam et al. | ............... 257/17 |
| 5,889,288 | A |  | 3/1999 | Futatsugi | .............. 257/20 |
| 6,093,945 | A |  | 7/2000 | Yang |  |
| 6,124,192 | A | * | 9/2000 | Jeng et al. | .............. 438/597 |
| 6,351,007 | B1 | * | 2/2002 | Fukushima et al. | ......... 257/314 |
| 6,504,206 | B2 | * | 1/2003 | Sung et al. | ............. 257/316 |
| 6,730,531 | B2 | * | 5/2004 | Park | .......................... 438/22 |
| 2002/0167839 | A1 |  | 11/2002 | Forbes et al. |  |
| 2002/0173100 | A1 | * | 11/2002 | Tanigami | ............. 438/263 |
| 2003/0132500 | A1 | * | 7/2003 | Jones et al. | ............... 257/500 |
| 2003/0153151 | A1 |  | 8/2003 | Choi et al. |  |

* cited by examiner

*Primary Examiner*—David Vu
*Assistant Examiner*—Andres Lopez-Esquerra
(74) *Attorney, Agent, or Firm*—Saliwanchik, Lloyd & Saliwanchik

(57) ABSTRACT

A method of fabricating a nonvolatile memory using quantum dots is disclosed. An example method sequentially forms a first insulation layer and a second insulation layer on a substrate where a predetermined device is formed. The example method also forms a hard mask by etching the second insulation layer, deposits silicon on the substrate where the hard mask is formed, forms quantum dots by etching the silicon through an etchback process, removes the hard mask, forms a third insulation layer on the substrate where the quantum dots are formed, and deposits a conductive layer on the third insulation and patterning it to form a gate.

10 Claims, 3 Drawing Sheets

METHODS OF FABRICATING NONVOLATILE MEMORY USING A QUANTUM DOT

RELATED APPLICATION

It is noted that this patent claims priority from Korean Patent Application Serial Number 10-2003-0101443, which was filed on Dec. 31, 2003, and is hereby-hereb incorporated by reference in its entirety.

TECHNICAL FIELD

The present disclosure relates to a semiconductor device and, more particularly, to a method of fabricating a non-volatile memory using a quantum dot.

BACKGROUND

The integration level of dynamic random access memory (hereinafter referred to as "DRAM") has increased year by year. Presently, a 64 gigabit DRAM cell having about a 70 nm design rule is expected to be manufactured by 2008, and a 1 terabit DRAM cell having about a 35 nm design rule is expected to be manufactured by 2014.

However, the conventional method of forming a layer, for example including an optical lithography technique and a chemical vapor deposition (hereinafter referred to as "CVD") technique, is useful to manufacture a 64 gigabit DRAM cell or 1 terabit DRAM cell. As a result, research on an improved method of manufacturing a high density DRAM cell has been carried out intensively.

A new lithography technique using an electron beam (hereinafter referred to as "EB") or X-ray has been developed as an alternative to the optical lithography technique, and an atomic layer deposition (ALD) technique has superseded the CVD technique. In addition, a semiconductor device is now feverishly under study, including a quantum dot of nanometric size, which can be applicable to a single electron gate.

A quantum dot can be formed using a focused ion beam (hereinafter referred to as "FIB"), or EB. The FIB or the EB can coercively put ions or atoms into a predetermined region of the semiconductor substrate and, advantageously, the FIB or the EB can easily control the size and the position of the quantum dot. However, the method of forming the quantum dot using the FIB or the EB has a low productivity and, thus, is not suitable for commercial applications.

The quantum dot can also be formed by nucleation of atoms. In particular, a non-crystalline layer having an amorphous substance is first formed, and then the non-crystalline layer is thermally processed to form a mono crystal. The method using the mono crystal provides a high productivity, but the size and the distribution of the quantum dot are hard to control.

DETAILED DESCRIPTION

Figure 1:
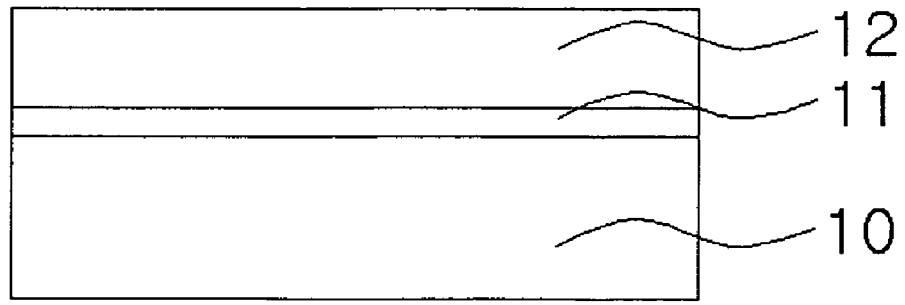
FIGS. 1 through 8 are cross-sectional views illustrating example processes of fabricating a nonvolatile memory using a quantum dot.

Referring to FIG. 1, a first insulation layer 11 and a second insulation layer 12 are sequentially deposited on a substrate 10 where a predetermined device is formed. Preferably, the first insulation layer 11 is made of oxide by means of thermal oxidation and the second insulation layer is made of nitride with a thickness between 100 Å and 500 Å.

Figure 2:
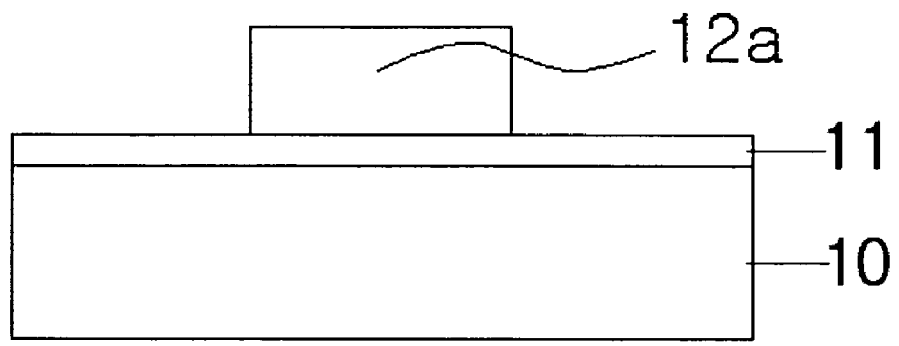

Referring to FIG. 2, a hard mask 12a is formed by etching the second insulation layer 12. Because the width of the hard mask determines the width between quantum dots, it should have a predetermined width. Moreover, the probability that the size of quantum dots can be changed, depending on the state of the sidewalls of the hard mask, should be considered as well.

Figure 3:
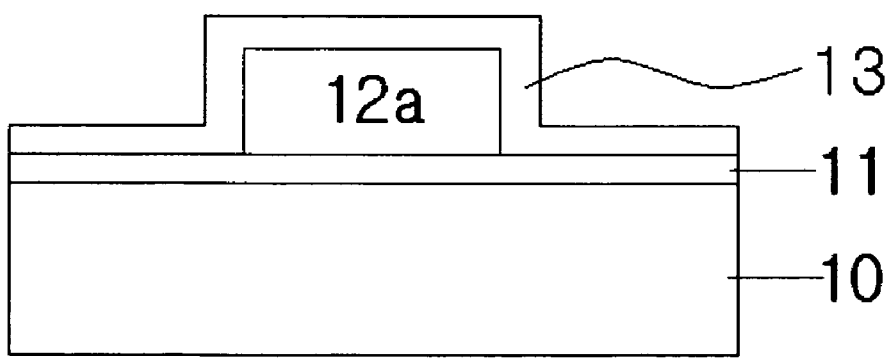

Referring to FIG. 3, a silicon layer 13 is deposited on the substrate where the hard mask is formed. The silicon layer 13 is to be deposited in consideration of the size of quantum dots to be formed, and preferably has a thickness between 10 Å and 200 Å.

Figure 4:
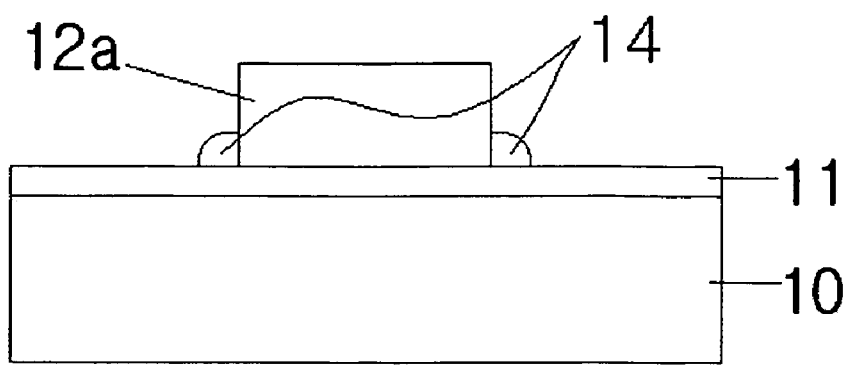

Referring to FIG. 4, quantum dots 14 are formed by etching the silicon layer 13 through an etchback process. The size of the quantum dots is adjustable by controlling the time for over-etch of the etchback process.

Figure 5:
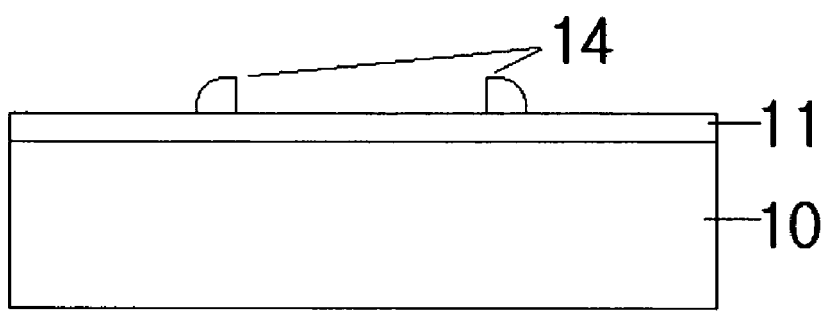

Referring to FIG. 5, the hard mask 12a is removed through an etch process except for the silicon on the sidewalls of the hard mask.

Figure 6:
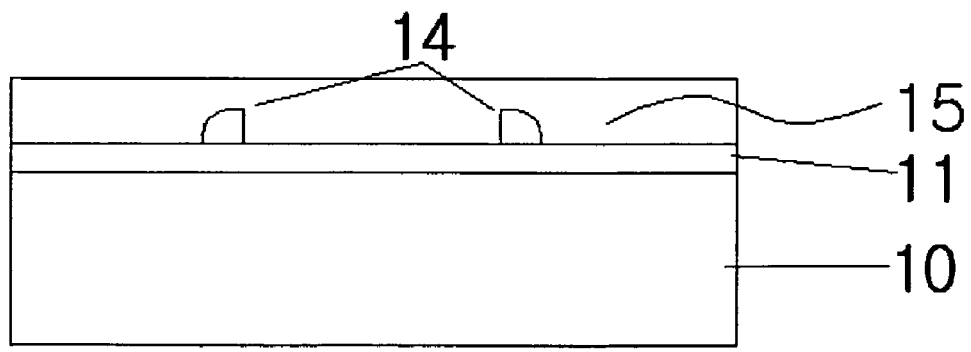

Referring to FIG. 6, a third insulation layer 15 is formed through a thermal oxidation process, fully covering the quantum dots on the first insulation layer 11. The thermal oxidation process should be conducted ensuring that the quantum dots made of silicon are not oxidized. The first insulation layer 11 and the third insulation layer 15 may be regarded as the same because both are physically and chemically difficult to distinguish.

Figure 7:
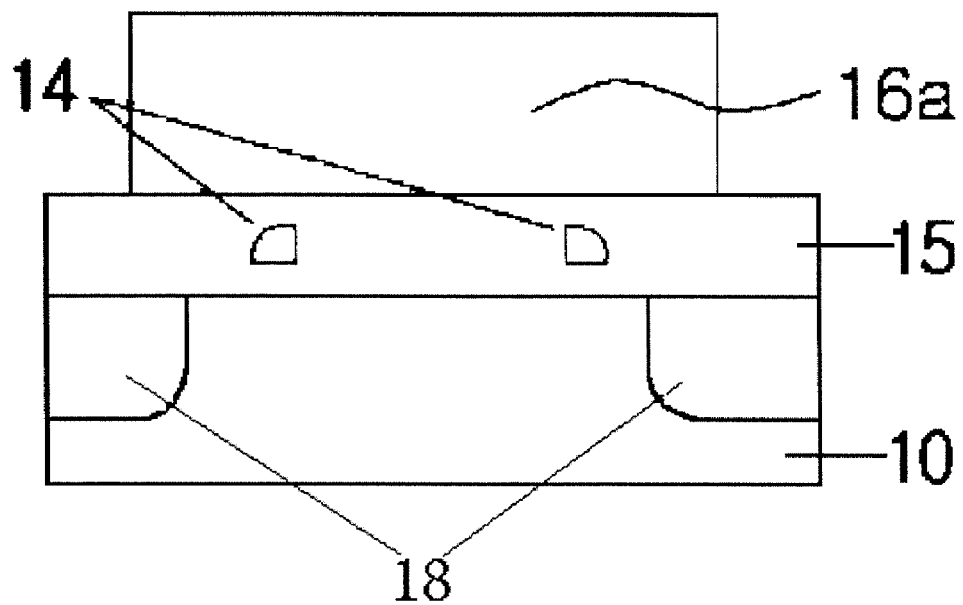

Two examples for forming a gate are described below. First, referring to FIG. 7, a conductive layer is deposited on the third insulation layer 15 and patterned to form a single gate 16a, so that the two quantum dots are positioned under the single gate 16a. After source and drain regions 18 are formed by implanting ions into the substrate, a nonvolatile memory using quantum dots is completed.

Figure 8:
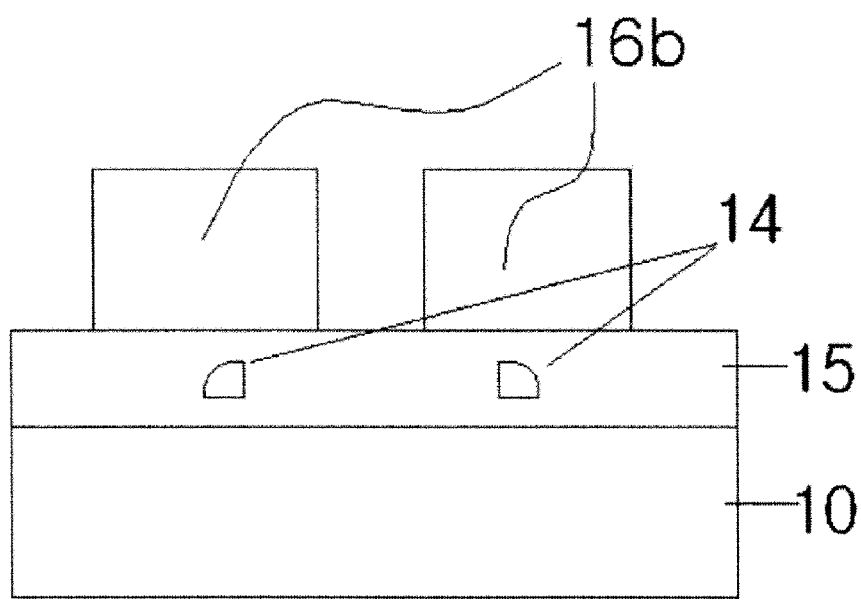

Second, referring to FIG. 8, a nonvolatile memory having a quantum dot 14 per a gate 16b can be formed as well.

In accordance with the disclosed method, the quantum dot with a diameter of several or tens of nanometers may be formed. Accordingly, the quantum dot may be formed with any desired size, in any desired position, and with uniform distribution since silicon is formed on the sidewalls of the hard mask.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method of fabricating a nonvolatile memory, comprising:
   sequentially forming a first insulating layer and a second insulating layer on a substrate where a predetermined device is formed;
   forming a hard mask by etching the second insulation layer;
   after forming the hard mask, depositing silicon on the substrate where the hard mask is formed, where in the silicon is formed conformally surrounding the hard mask;
   forming quantum dots by etching the silicon through an etchback process, wherein the quantum dots are formed to a height less than the height of the hard mask;
   removing the hard mask;

forming a third insulation layer on the substrate where the quantum dots are formed, and;

depositing a conductive layer on the third insulation layer and pattering it to form a gate.

2. The method as defined by claim 1, wherein the first insulation layer is made of oxide.

3. The method as defined by claim 1, wherein the second insulation layer is made of nitride.

4. The method as defined by claim 1, wherein the second insulation layer is formed with a thickness between 100 Å and 500 Å.

5. The method as defined by claim 1, wherein the silicon is deposited with a thickness between 10 Å and 200 Å.

6. The method as defined by claim 1, wherein the third insulation layer is formed through a thermal oxidation process to cover the quantum dots.

7. The method as defined by claim 1, wherein two quantum dots are positioned under the gate.

8. The method as defined by claim 1, wherein one quantum dot is positioned under the gate.

9. The method as defined by claim 1, wherein the first insulation layer and the third insulation layer are physically and chemically the same.

10. The method as defined by claim 1, wherein the first insulation layer is formed through a thermal oxidation process.

* * * * *